(12) United States Patent
Koul et al.

(10) Patent No.: US 10,684,123 B2
(45) Date of Patent: Jun. 16, 2020

(54) FIBER WEAVE SKEW ASSESSMENT FOR PRINTED CIRCUIT BOARDS

(71) Applicant: CISCO TECHNOLOGY, INC., San Jose, CA (US)

(72) Inventors: Amendra Koul, San Francisco, CA (US); Yaochao Yang, Fremont, CA (US); Mike Sapozhnikov, San Jose, CA (US); Joel Richard Goergen, Soulsbyville, CA (US); Kartheek Nalla, Milpitas, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 2 days.

(21) Appl. No.: 15/872,163

(22) Filed: Jan. 16, 2018

(65) Prior Publication Data
US 2019/0219385 A1    Jul. 18, 2019

(51) Int. Cl.
| | | |
|---|---|---|
| *G01B 11/04* | (2006.01) | |
| *G01B 11/24* | (2006.01) | |
| *G01N 21/956* | (2006.01) | |
| *G01B 11/26* | (2006.01) | |
| *H05K 3/00* | (2006.01) | |

(52) U.S. Cl.
CPC ............. *G01B 11/24* (2013.01); *G01B 11/26* (2013.01); *G01N 21/956* (2013.01); *H05K 3/00* (2013.01); *G01N 2021/95638* (2013.01)

(58) Field of Classification Search
CPC . G01N 2/956; G01N 2021/95638; H05K 1/02
See application file for complete search history.

(56) References Cited

U.S. PATENT DOCUMENTS

| | | |
|---|---|---|
| 6,983,434 B1 | 1/2006 | Frank et al. |
| 7,339,646 B2 | 3/2008 | Izawa et al. |

(Continued)

FOREIGN PATENT DOCUMENTS

| | | |
|---|---|---|
| CN | 103164559 A | 6/2013 |
| CN | 105845594 A | 8/2016 |

(Continued)

OTHER PUBLICATIONS

Sinnonovich, Lambert "Practical Fiber Weave Effect Modeling White Paper—Issue 3", Lamisim Enterprises Mar. 2, 2012 (Year: 2012).*

(Continued)

*Primary Examiner* — Rebecca C Bryant
(74) *Attorney, Agent, or Firm* — Cindy Kaplan

(57) ABSTRACT

In one embodiment, a method generally comprises importing a layout identifying routing information for a plurality of differential pair traces on a printed circuit board at a skew assessment module, receiving values for a plurality of skew parameters associated with fiber weave skew, receiving variation parameters from a database comprising data collected on fiber weave variation for one or more of the skew parameters, calculating a skew estimate for the printed circuit board based on the skew parameters and the variation parameters at the skew assessment module, and determining if the skew estimate is within a specified skew allowance for the printed circuit board.

10 Claims, 12 Drawing Sheets

(56) References Cited

U.S. PATENT DOCUMENTS

| 8,304,659 | B2* | 11/2012 | Goergen | H01P 3/081 |
| | | | | 174/255 |
| 8,793,631 | B2 | 7/2014 | Wu et al. | |
| 2017/0339780 | A1* | 11/2017 | Bisson | H05K 3/0005 |
| 2018/0113974 | A1* | 4/2018 | Boday | G06F 17/5077 |

FOREIGN PATENT DOCUMENTS

| CN | 106683600 A | 5/2017 |
| CN | 107194058 A | 9/2017 |

OTHER PUBLICATIONS

Shlepnev, Yuriy and Chudy Nwachukwu "Modeling Skew and Jitter induced by Fiber weave effect in PCB dielectrics", 2014 IEEE International Symposium on Electromagnetic Compatability, Raleigh North Carolina, Aug. 7, 2014 (Year: 2014).*

Altera Corporation "PCB Dielectric Material Selection and Fiber Weave Effect on High Speed Channel Routing", Jan. 2011 (Year: 2011).*

* cited by examiner

| Trace Identification | Segment-wise Skew | | | Total Skew |
|---|---|---|---|---|
| | A | B | C | |
| Trace 1 | 5s | 10s | 15s | 30s |
| Trace 2 | 1s | 2s | 4s | 7s |
| Trace 3 | 1s | 2s | 3s | 6s |

FIBER WEAVE SKEW ASSESSMENT FOR PRINTED CIRCUIT BOARDS

TECHNICAL FIELD

The present disclosure relates generally to printed circuit boards (PCBs), and more particularly, to assessment of fiber weave skew in PCBs.

BACKGROUND

Fiber weave skew is an increasingly important problem for high speed serial links running differential pairs. The problem arises when the time delay of one line in a differential pair is different than the other line. A common source of line-to-line skew is from local variation in the dielectric constant the lines see due to the inhomogeneous nature of the fiber-resin composite system.

BRIEF DESCRIPTION OF THE DRAWINGS

FIG. 4 is a table showing an example of skew assessment output, in accordance with one embodiment.

Corresponding reference characters indicate corresponding parts throughout the several views of the drawings.

DESCRIPTION OF EXAMPLE EMBODIMENTS

Overview

In one embodiment, a method generally comprises receiving a layout identifying routing information for a plurality of differential pair traces on a printed circuit board at a skew assessment module, receiving values for a plurality of skew parameters associated with fiber weave skew, receiving variation parameters from a database comprising data collected on fiber weave variation for one or more of the skew parameters, calculating a fiber wave skew estimate based on the skew parameters and variation parameters at the skew assessment module, and determining if the fiber weave skew estimate is within a specified skew allowance.

In another embodiment, a method generally comprises inspecting a fiber weave for use in a printed circuit board with an automated optical inspection tool and identifying a distance between fiber bundles in the fiber weave. The fiber weave comprises a plurality of the fiber bundles woven to form the fiber weave and a portion of the fiber bundles comprise markers. Identifying a distance between the fiber bundles in the fiber weave comprises measuring a distance between the markers.

In yet another embodiment, a method generally comprises inspecting a layer of a printed circuit board through an inspection window comprising an opening formed in one or more other layers of the printed circuit board, and identifying a location of a trace aligned with the inspection window, relative to a maker in a fiber bundle of a fiber weave to assess fiber weave skew.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Figure 1:
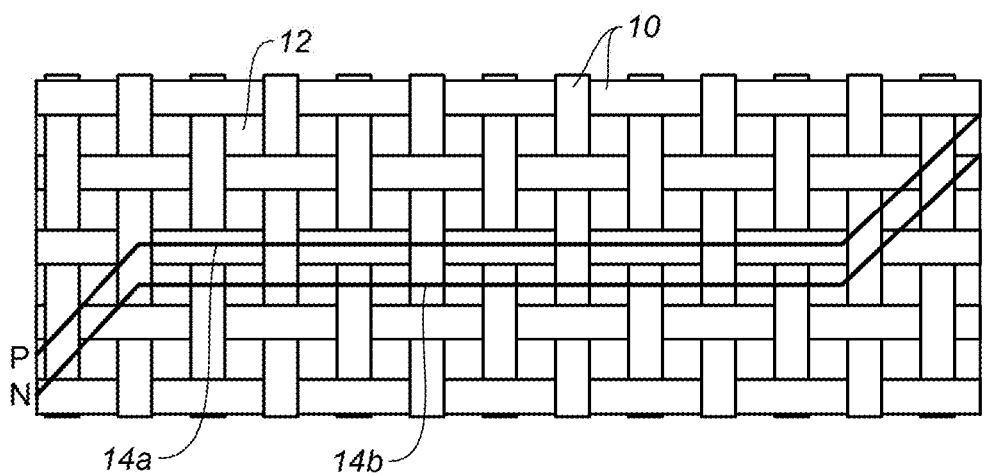
FIG. 1 is a top view showing a differential pair routed over a fiber-resin composite system.

Typical PCB (printed circuit board) substrates are constructed from various woven fiber fabrics strengthened and bound together with epoxy resin. As shown in the example of FIG. 1, a PCB laminate is made up of woven fiber 10 impregnated with an epoxy resin 12. Due to the non-homogenous nature of PCB laminates, the fiber weave based materials may cause signals to propagate at different speeds within differential pair traces 14a, 14b. As shown in FIG. 1, when one trace 14a (positive trace P) lines up over a bundle of glass yarns 10 for a portion of its length, it will have a different propagation delay as compared to another trace 14b (negative trace N) of the same length that lines up over mostly resin 12. The two traces 14a, 14b shown in FIG. 1 have different effective dielectric constants (Dk) since resin and glass have two different dielectric constants. This results in different propagation velocities and may cause skew between P and N signals of the differential pair.

The effect described above is referred to herein as fiber weave skew (also referred to as glass weave skew, phase skew, timing skew, line-to-line skew, P/N skew, or skew). Skew can have a negative impact on s-parameters, eye margin (eye width, eye height, eye closure at a receiver), link performance, bit-error-rate (BER) performance, channel budget, and Electro-Magnetic Interference (EMI), and becomes worse as length increases. Fiber weave skew becomes more of an issue as bit rates continue to rise. For example, low skew is critical for serializer/deserializer (Ser- Des) speeds greater than 20 Gbps (high speed SerDes designs) (or other high speeds). The random alignment of trace to fiber bundles makes fiber weave skew difficult to diagnose.

The embodiments described herein provide for assessment of fiber weave skew in PCBs. In one or more embodiments, relative skew of routed traces may be calculated to assess skew related PCB yield impact in manufacturing and buy back eye margin lost due to glass weave skew on high speed signals. In one embodiment, a fiber weave skew assessment technique estimates differential pair skew based on a number of design parameters and variation parameters. As described in detail below, output from the fiber weave skew assessment may provide a relative skew to identify traces that are likely to have more skew as compared to other traces in the PCB routing based on user defined variables and a knowledge database of known fiber weave variation. This may be used to enable designers to buy back performance improvements that would otherwise be lost due to fiber weave skew. Actual skew measurements on manufactured boards may then be used to refine a PCB design. In one or more embodiments, a fiber bundle marker may be used to screen weave styles in manufacturing. Automated optical inspection may be used to perform layer analysis or inspect assembled boards through an inspection window and provide skew related data based on location of a trace relative to the bundle marker, as described further below.

PCB Design Fiber Weave Skew Assessment

In one or more embodiments, a fiber weave skew assessment technique may be used to estimate differential pair skew on a routed PCB and thereby improve yield in manufacturing. As described below, output from the fiber weave skew assessment is a relative skew unit used to identify traces likely to have more skew relative to other traces for a PCB routing based on user defined skew parameters and variation parameters.

In one embodiment, user defined skew parameters relating to routing, weave, and material are input to a fiber weave assessment algorithm. The parameters may be defined to estimate fiber weave skew and may include, for example, one or more of the following parameters: differential pair routing pitch; glass weave style from stack up; Dk data for glass fiber and resin in the stack up; glass weave bundle dimensions and resulting weave openings; short vs long grain panel to find warp direction/panel orientation; panel or PCB rotation degree; or any combination of these or other user defined skew parameters.

The differential pair routing pitch is based on the routed design of the trace. The term trace as used herein may refer to a chip-to-chip trace, one or more segments of a trace, or a differential pair trace. The differential pair routing pitch may be defined by the routing of the differential pair on the circuit board as specified by a designer (or trace routing program). This information may be obtained from an imported PCB design layout. Additional design parameters such as panel or PCB rotation, panel orientation (short or long grain), and material or weave selection may be user defined. Some of the parameters may be based on the material (e.g., Dk data for glass fiber and resin), weave style (e.g., yarn type (E-glass, L-glass, NE-glass, etc.), weave type (e.g., as defined in IPC standard (e.g., 106, 1080, 2113, 2116, 3313, etc.)), spread type (based on manufacturer process), or glass (warp) direction (panel orientation) (short grain (e.g., 18G×20), long grain (e.g., 18×20G)).

Figure 2:
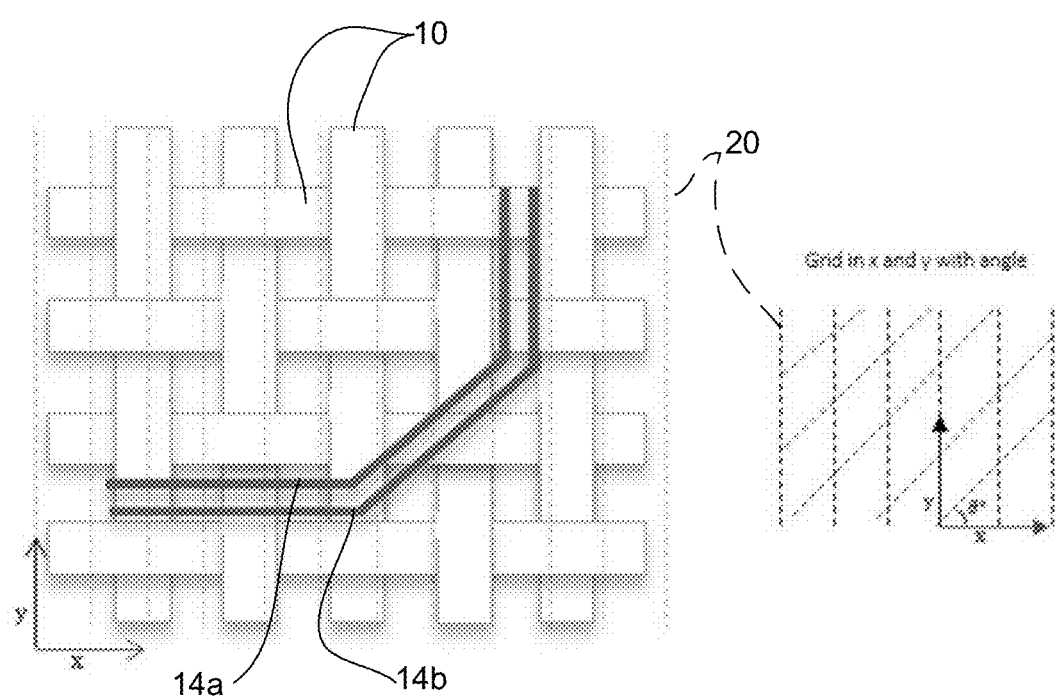
FIG. 2 illustrates an example of a reference plane used to identify a location of the differential pair relative to a fiber weave.

FIG. 2 illustrates one example of a grid that may be used to define one or more of the board layout geometry parameters. In one example, a mesh grid 20 is established at each layer with $\Delta x_i$ and $\Delta y_i$ defined as offsets in x and y direction, respectively, where "i" refers to a layer at which the grid is defined. A variable θ° refers to an angle between grids at "i" layers to analyze angled routing. FIG. 2 shows routing traces 14a, 14b relative to fiber weave 10 and dotted grid 20 provided as a reference.

In addition to the user defined skew parameters, variation/sweep parameters may be defined to control variation of one or more parameters such as bundle dimension and relative location of weave with respect to a differential pair. The IPC standard defines for different glass styles and weave, a warp count, fill count, warp yarn, fill yarn, fabric thickness, and fabric nominal weight. However, the IPC standard does not define widths and gaps of glass bundles, which may vary based on weave style, material, manufacturing process, or manufacturer.

Figure 3:
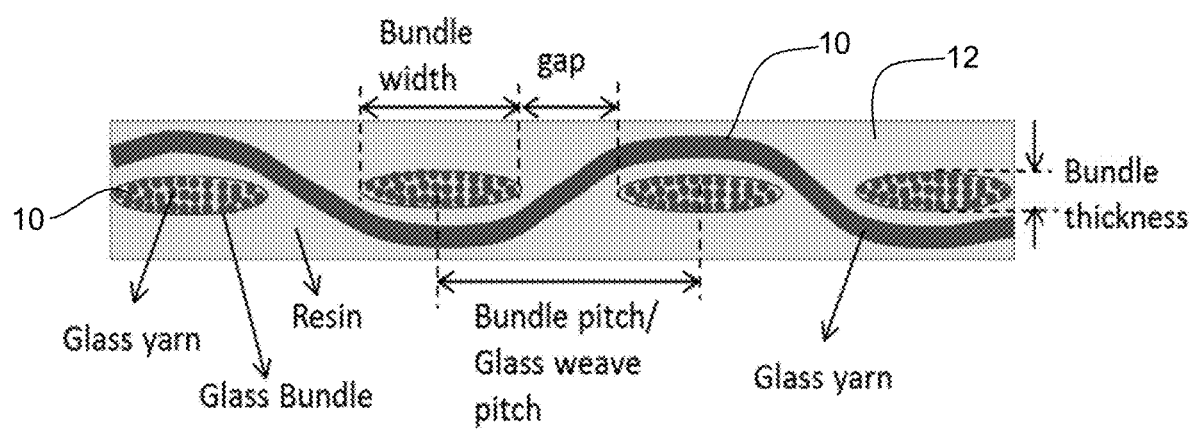
FIG. 3 is a cross-sectional view of the fiber-resin composite system of FIG. 1 showing dimensions associated with the fiber weave.

FIG. 3 is a cross-section of a composite sheet illustrating how variation parameters may be defined in accordance with one embodiment. The composite sheet includes bundles 10 surrounded by epoxy resin 12. The bundles 10 are woven as shown in the top view of FIG. 1, thus the bundles 10 are shown in cross-section in one direction and as a continuous thread in a generally perpendicular direction. The fiber weave shown in the example of FIG. 3 is formed from glass bundles comprising glass yarn. The bundle pitch/glass weave pitch is defined as the distance between two adjacent and generally parallel bundles measured from center to center and may be calculated from bundle count per inch. A bundle width is defined as the width of the bundle 10 within the resin 12. A gap is defined as the distance between two parallel bundles and a bundle thickness is defined as the thickness (height) of the bundle as shown in FIG. 3.

The user defined skew parameters along with the variation parameters may be modified during the assessment to control variation of some of the parameters such as bundle dimensions and relative location of weave with respect to a differential pair. The fiber weave bundle dimensions and resulting weave openings, along with typical variations for these measurements may be based on data collected in a knowledge database. In one example, samples produced by different manufacturers, for different material types, glass weave styles, glass and resin material, spread process, glass direction, or any combination of these or other factors, may be analyzed by various means and statistical data collected and stored in the knowledge database. Data may be collected for different types of glass and resin, different spreading techniques (e.g., 1 side vs. 2 side spreading), warp/fill data and hole size dimensions (hole size may be different in warp and fill directions), dimensions of glass bundles per glass style, or any combination of these or other parameters. In one example, one or more parameters may be defined based on the selected glass. The pitch dimension may be defined as a minimum and maximum bundle pitch dimension in prepeg and core configuration in warp/fill directions. Variation parameters may also be defined for Dk data for glass and resin and cross-section geometry for glass and trace configurations.

As described above, the parameters input to the fiber weave skew assessment include user defined skew parameters (e.g., routing parameters based on board layout, material selection, weave style, panel orientation (short/long, rotation), etc.) and variation parameters (e.g., weave geometry (e.g., minimum/maximum bundle dimensions) material variation, etc.) based on data collected for different configuration samples from different manufacturers.

It is to be understood that the parameters described herein are only examples and any combination of these or other parameters may be used to estimate skew for fiber weave skew assessment. As previously described, one or more parameters may be based on a knowledge database built through measurement of manufacturing samples (e.g., test coupons) and used to fine tune one or more parameters. As described below, the design may be adjusted based on an initial assessment and an iterative process may be used to buy back margin from fiber weave skew. For example, user defined skew parameters may be input for an asymmetry condition, a solution space defined with the variation parameters (e.g., from knowledge database), and a relative skew defined as a function of data from the solution space. The skew analysis thus depends on user defined skew parameters and variation parameters that form a solution space used in the fiber skew assessment process.

The assessment process may be performed at a fiber skew assessment module in communication with the knowledge database and operable to receive user input (e.g., board layout, material selections, weave style, etc.) through a user interface (e.g., graphical user interface (GUI), communication link, API (application programming interface) for importing board design layout).

FIG. 4 is table illustrating an example of output data from a fiber weave skew assessment analyzer (module) for a fiber skew assessment process. The output is for three traces (Trace 1, Trace 2, Trace 3), with each trace (e.g., differential pair) broken up into three segments (A, B, C) and a segment skew provided for each segment of the trace. The segment may comprise, for example, a horizontal portion, angled portion, and vertical portion as shown in FIGS. 1 and 2. The total skew for each trace is a cumulative skew (e.g., skew A+skew B+skew C). The total skew is a relative skew unit that identifies the traces that are likely to have more skew relative to other traces for the given PCB routing based on the user defined solution space described above. The actual skew may be solved for using a field solver algorithm, for example, however, this would use a large amount of resources (processing). The relative skew may be used to determine if a trace is within a specified budget or limit (e.g., <10 s or any other specified limit).

Figure 5:
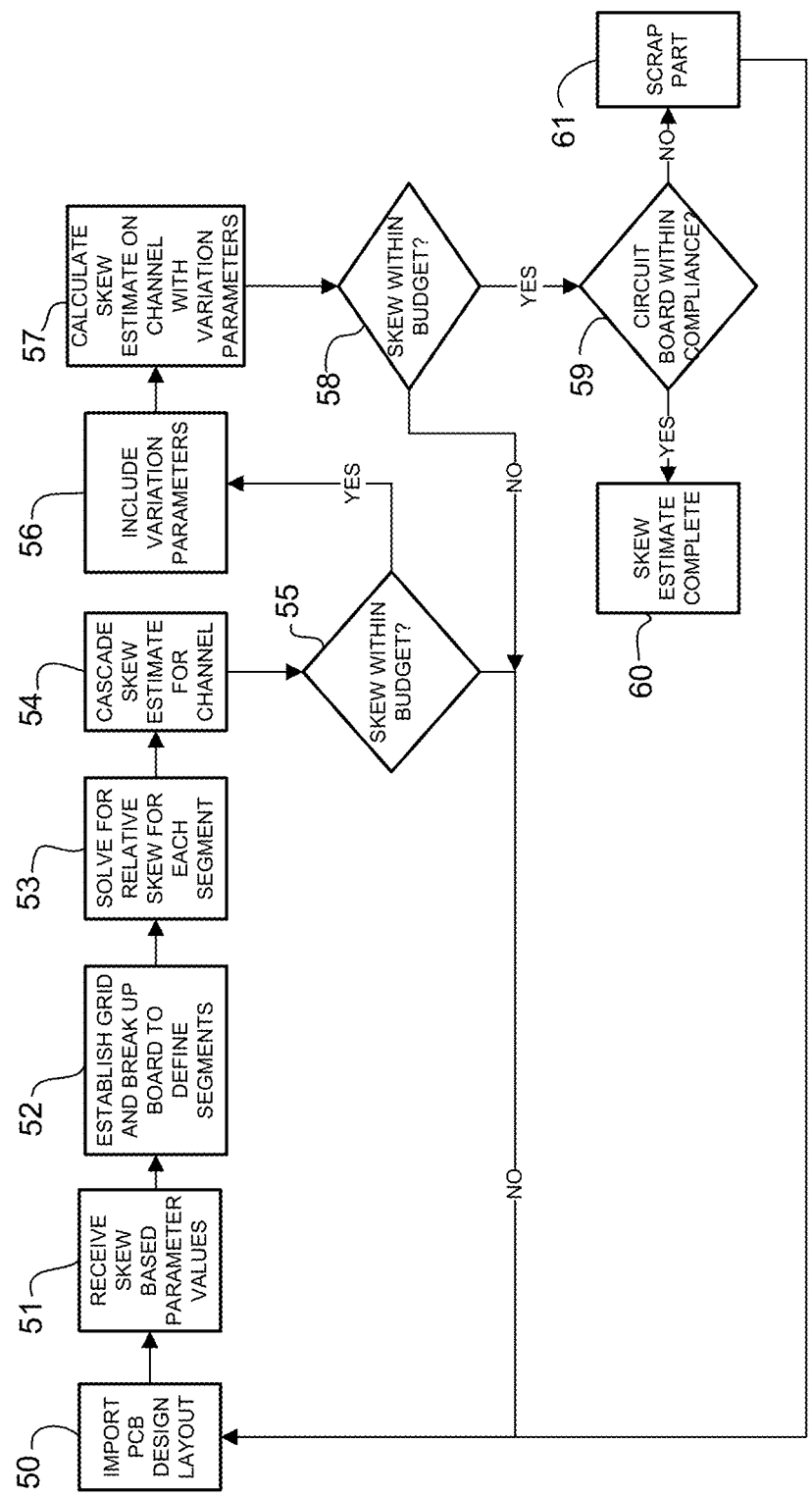
FIG. 5 is a flowchart illustrating a process for assessing fiber weave skew, in accordance with one embodiment.

FIG. 5 is a flowchart illustrating a process for assessing fiber weave skew in a PCB design, in accordance with one embodiment. At step 50, a PCB design layout identifying routing information for a plurality of differential pair traces on a printed circuit board is imported (input, received) at a skew assessment module (e.g., program, code, logic, computer, network device). Values for skew based parameters associated with fiber weave skew are also entered (step 51). The values may be input, for example, at a graphical user interface or programmed for a selected design. As previously described, the skew parameters are specific to a PCB. Common segments of the PCB may be broken up into unique topology segments for faster analysis (step 52). The layout design and skew based parameters are used to calculate a relative skew for each of the topology segments (step 53). The skew results for the segments are cascaded after analysis to provide a skew estimate for a channel (e.g., chip-to-chip differential pair trace) (step 54).

If the skew (relative skew) is not within budget (step 55), the process may be started over at step 50, with a designer varying one or more skew based parameters (e.g., PCB design layout, glass weave, material, etc.). For example, a designer may vary skew parameters such as glass style, resulting in a different stack up, or PCB routing options such as angle or differential pair pitch to improve the skew on differential pair routing. The skew budget may be a predefined or specified relative skew limit per channel or for a layer of the board, or a complete PCB, for example.

If the relative skew is within budget (step 55), the variation parameters may then be used to determine if the skew estimate for the channel is still within acceptable limits (steps 56, 57, and 58). For example, if the skew estimate (relative skew) meets a specified skew budget after initial simulation, variation/sweep parameters may be included to get an estimate of the minimum/maximum skew for the channel. As previously described, the variation parameters may be received from a database comprising data collected on fiber weave variation for one or more of the skew parameters. A skew estimate is calculated for the printed circuit board based on the skew parameters and the variation parameters and it is determined if the skew estimate is within a specified skew allowance for the printed circuit board design (step 58). The skew allowance at step 58 may be per channel, layer, or for the entire PCB and may be the same value as used at step 55 or a different limit to account for additional offset due to variation parameters. If the relative skew estimate is not within budget at step 58, the process may be started over at step 50 with one or more new user defined skew parameters.

If the calculated skew is within budget at step 58, the PCB may be manufactured and circuit board compliance may be verified using any appropriate testing means, including for example, glass marker or inspection window techniques described below (step 59). If the skew analysis of the manufactured PCB is within acceptable limits, the skew estimate process is complete (steps 59 and 60), otherwise the PCB may be scrapped (step 61) and the process started over at step 50 using the knowledge learned in the first iterative process or a new part may be manufactured to see if the defect was due to a manufacturing error.

It is to be understood that the process shown in FIG. 5 is only an example and that steps may be added, removed, combined, or modified, without departing from the scope of the embodiments. For example, the fiber skew analysis process as set forth in steps 50-58 may be performed on its own without a manufacturing verification (steps 59, 60, and 61). It should be noted that the process described above refers to one chip to chip channel broken down into segments, however, the process may also be performed for an aggregation of skew over layers. Also, the manufacturing compliance verification process (described below) may be performed on its own, without the initial skew assessment process.

PCB Manufacturing Fiber Weave Skew Assessment

As described above with respect to the process of FIG. 5, actual skew measurements (or relative skew measurements) may be used to refine the PCB design or determine if a manufactured board is in compliance with a specified skew allowance. In one or more embodiments, a fiber bundle marker may be used to screen fiber weave styles in manufacturing. Automated optical inspection may be used to perform layer analysis or an inspection window may be created in the PCB to provide a skew assessment, as described below.

Figure 6A:
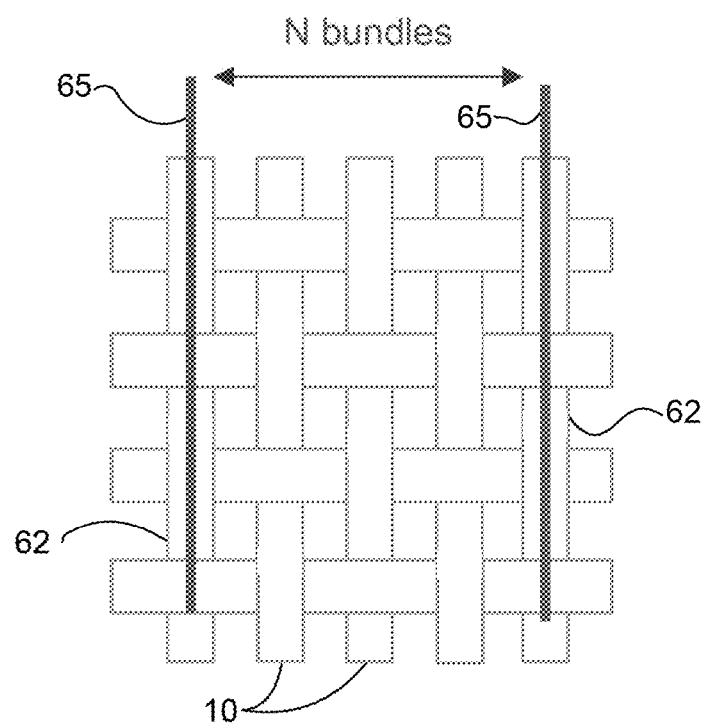
FIG. 6A illustrates fiber bundle markers for use in evaluating fiber weaves, in accordance with one embodiment.

In one or more embodiments, a glass marker image may be used to screen different glass styles and determine variation in bundles. Each glass style may have a different marker image based on its dimensions. In the example shown in FIG. 6A, every fourth fiber (glass) bundle 62 comprises a marker 65. The marker 65 may be inserted at any interval (with any number of bundles 10 therebetween) and may be inserted in both directions (warp and fill directions). For simplification, markers 65 are only shown in one direction in FIG. 6A. The marker 65 may be used to check glass style quality as received from a manufacturer and also to define variation parameters (e.g., collected data in knowledge database) for use in the fiber skew assessment analysis described above. Criteria for screening may be user defined as a glass weave pitch±x mils as a check at every N bundles, for example. Based on simulation data, accepted tolerances may be defined for scrapping criteria. The screening criteria may be dependent on cost or design, for example. As described below, the markers 65 may also be used to help with orientation of traces with respect to glass weave in warp and fill directions.

In one or more embodiments, the marker 65 may be embedded within the glass using any color strand or indicator. For example, when the glass is woven, some of the yarns may be a different color or have a visible marker embedded therein. Different color wavelengths may be used for different glass styles. The marker may also be defined in the PCB design and etched on the PCB every N bundles in both warp and fill directions. The etched marker may be incorporated into the PCB design to perform an alignment check and may be a copper trace placed at the same time that traces are etched into the layer, for example.

Figure 6B:
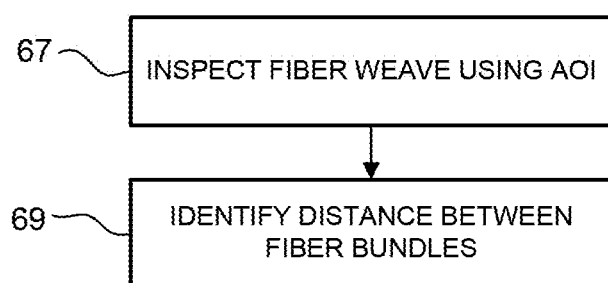
FIG. 6B is a flowchart illustrating an overview of a process for inspecting a fiber weave for use in a printed circuit board, in accordance with one embodiment.

FIG. 6B is a flowchart illustrating an overview of a process for inspecting a fiber weave, in accordance with one embodiment. In one or more embodiments, the fiber weave is inspected with an automated optical inspection (AOI) tool (step 67). A distance is identified between fiber bundles in the fiber weave (step 69). As described above with respect to FIG. 6A, a portion of the fiber bundles 62 comprise markers 65 (e.g., marker embedded in glass bundle, etched marker). The distance between the fiber bundles is identified by measuring a distance between the markers 65. The measured distance may be a relative distance identified by the AOI or an actual measurement taken between markers.

Figure 7:
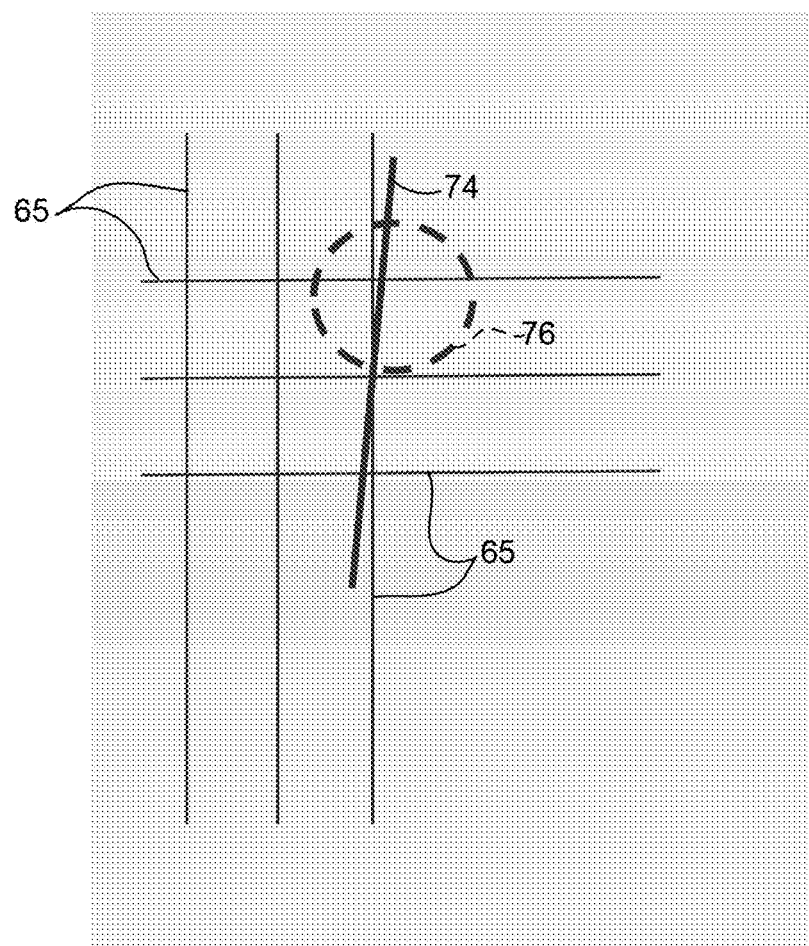
FIG. 7 illustrates automated optical inspection of a trace relative to the fiber bundle markers, in accordance with one embodiment.

As shown in FIG. 7, the embedded marker 65 may be used to identify an orientation or offset of a trace 74. The alignment marker 65 may be aligned to the etched PCB trace 74 using an AOI tool (as indicated at 76) with specific resolution to find anomalies.

The AOI tool allows for automated visual inspection of the fiber weave, layer (or layers) of a PCB, or a PCB through an inspection window described below. In one example, a camera or other optical measurement device may automatically scan the unit under test. The AOI tool may be configured to identify an offset between the traces and embedded markers or fiber weave skew (or relative skew) that exceeds allowable limits. In one or more embodiments, an algorithm may be used to calculate fiber weave skew based on measured offsets.

The marker 65 may be applied, for example, every 10 bundles across the fiber (e.g., 17 mils wide with a marker every 10 bundles that covers 170 mils+17 mils for the 11$^{th}$ bundle, or at any other interval) to allow an AOI tool to accurately determine copper trace placement relative to a glass bundle center line, as well as calculate locational offset. AOI may be used to perform core layer analysis including bundle width accuracy, weave consistency across the panel, and copper trace offset to glass bundle center. This allows a core layer to be evaluated before it is assembled into the circuit board book for pressing.

Figure 8A:
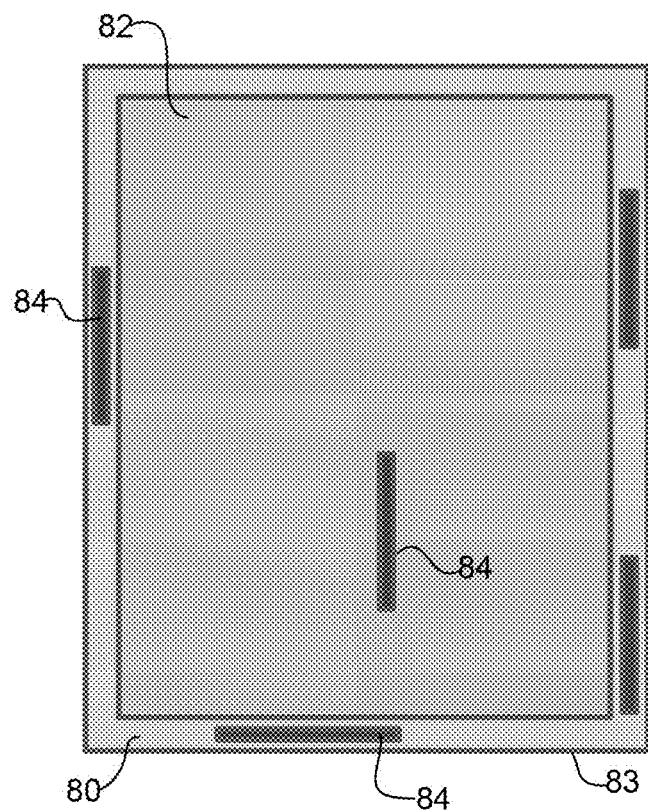
FIG. 8A is a top view showing circuit board inspection windows, in accordance with one embodiment.

In one embodiment, one or more inspection windows may be created to inspect one or more layers of a PCB after the PCB is assembled. FIG. 8A is a top view of a circuit board showing inspection windows 84 located within a circuit board 82 and outer frame 83. The circuit board frame (also referred to as a circuit board panel) 83 extends around the circuit board 82 and includes a flow dam area 80. The frame and circuit board may include any number of bundle inspection windows 84 at multiple locations for inspection of multiple layers within the board as described below. The inspection windows 84 in the frame 83 allow for board inspection without impacting the circuit board design.

Figure 8B:
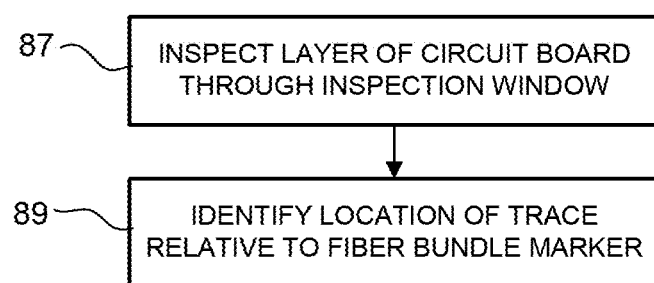
FIG. 8B is a flowchart illustrating an overview of a process for inspecting a layer of a printed circuit board through the inspection window, in accordance with one embodiment.

FIG. 8B is a flowchart illustrating an overview of a process for inspecting a layer of the printed circuit board through an inspection window, in accordance with one embodiment. A layer of the printed circuit board is inspected through the inspection window comprising an opening formed in one or more other layers of the printed circuit board (step 87). As described below, multiple inspection windows may be formed to inspect multiple layers of the circuit board. A location of a trace 74 aligned with the inspection window 84 is identified relative to a marker 65 in the fiber bundle of the fiber weave to assess fiber weave skew (step 89) (FIGS. 7, 8A, and 8B).

Figure 9A:
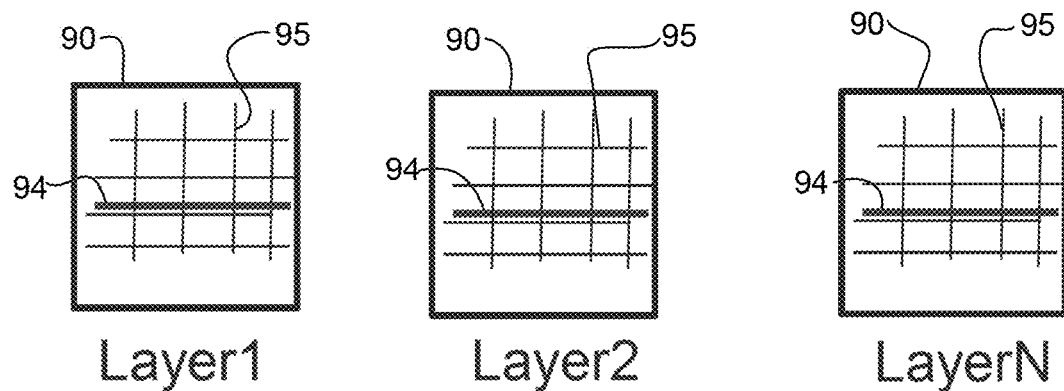
FIG. 9A is a top view showing layers of a circuit board with the fiber bundle markers, in accordance with one embodiment.
Figure 9B:
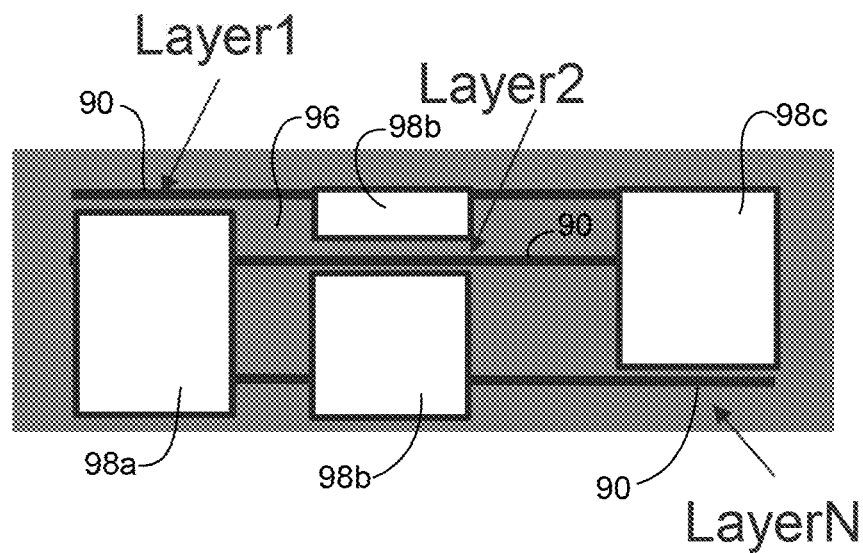
FIG. 9B is a cross-section view of a circuit board showing inspection windows for each of the layers of FIG. 9A.

FIG. 9A is a top panel view of multiple layers 90 (Layer 1, Layer 2, Layer N) comprising copper traces 94 and bundle markers 95. The term "layer" as used herein may refer to a copper sheet and fiber weave/resin composite material, a core comprising a fiber weave/resin layer interposed between two copper sheets, or any other combination of copper and fiber weave/resin layers. FIG. 9B is a side circuit board view showing the three stacked layers (Layer 1, Layer 2, Layer N) of FIG. 9A with glass and copper punch-outs (openings) 98a, 98b, 98c formed in the layers to provide an inspection window for each layer. Opening 98a is formed in Layer 2 and Layer N to create an inspection window aligned with the trace 94 to view the location of the trace relative to the bundle markers 95 in Layer 1. Openings 98b are formed in Layer 1 and Layer N to provide inspection windows above and below Layer 2. Openings 98c are formed in Layer 1 and Layer 2 to provide an inspection window to view Layer N from above (as viewed in FIG. 9B). Window gaps 96 are provided between the layers to prevent dry fill. The gap 96 provides enough resin to fill the void during a press cycle.

Figure 10:
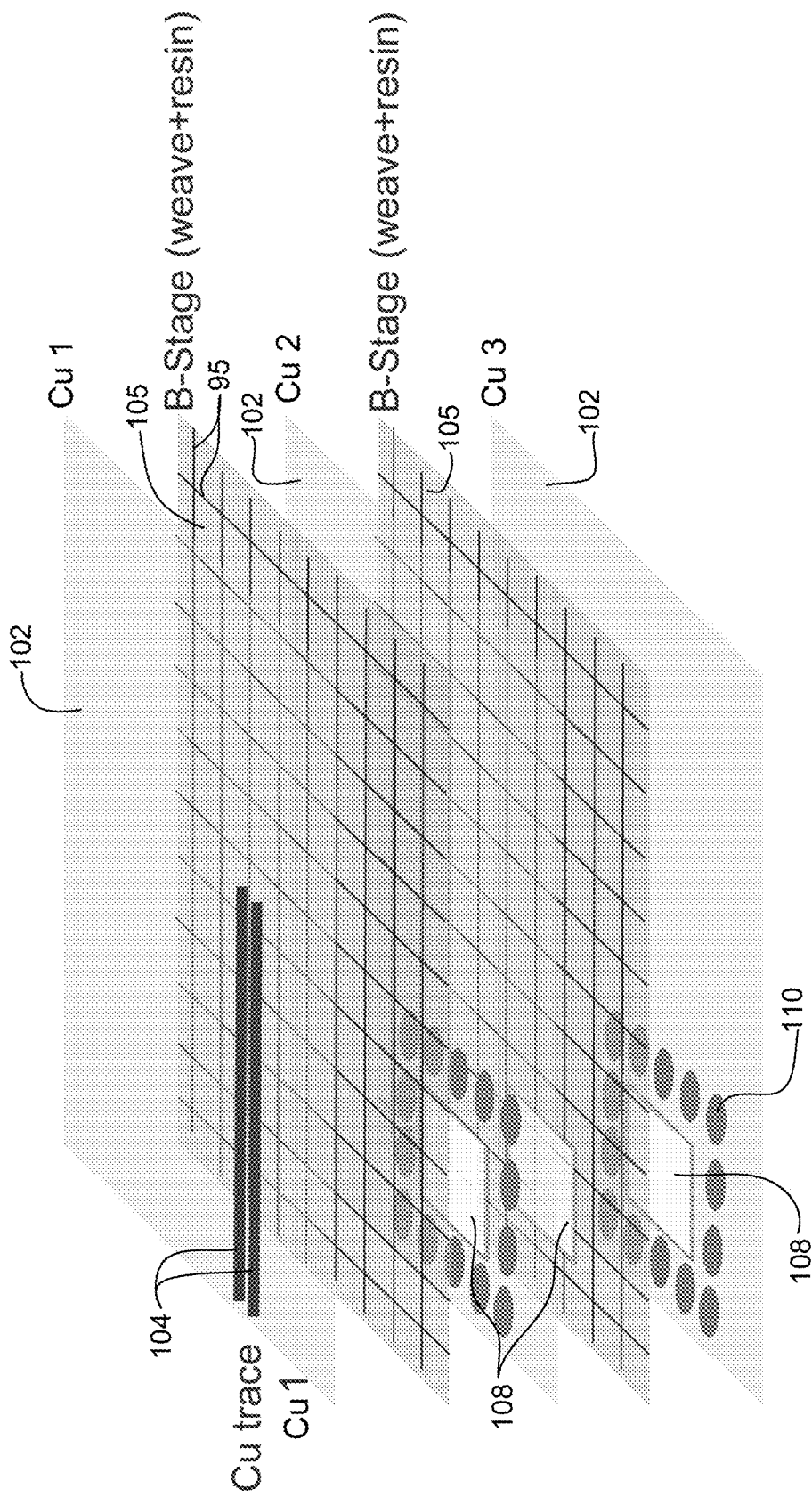
FIG. 10 is a perspective showing the inspection window in an exploded layer view.

FIG. 10 is a perspective exploded view showing copper sheets (Cu 1, Cu 2, Cu 3) and B-stages (fiber weave+resin) 105. In this example, openings 108 are formed in copper sheets Cu 2 and Cu 3 and the B-stage interposed between these copper sheets to form an inspection window for viewing aligned copper traces 104 etched in copper sheet Cu 1 relative to the bundle markers 95 in the adjacent B-stage. All layers 102, 105 are assembled in order for the press cycle. In the example shown in FIG. 10, a square punch 108 (e.g., 200 mils by 200 mils or any other suitable size or shape) is surrounded by a flow dam 110 in the copper sheet to control resin depletion during the press cycle. The punch-out 108 may be formed during panel alignment hole punch. The flow dams 110 are provided to control resin flow during the press/thermal cycle to make and cure the circuit board. After the outer copper layers are etched, the window 108 is created showing copper traces 104 relative to the marker bundles 95 in weave 105 and resin is filled the rest of the way through. An AOI (e.g., microscope with measuring lines) may be used to determine the trace location relative to the glass bundle.

It is to be understood that the layout shown in FIG. 10 is only an example and any number of inspection windows may be formed for identifying skew in any number of layers or PCB assembly comprising any number of cores, layers, copper sheets, or fiber weave+resin layers. For example, each layer may include any number of inspection windows 108 for viewing traces 104 relative to marker bundles 95 and determining fiber weave skew in one or more layers. The inspection may be performed on a plurality of layers (e.g., one or more core) or on the assembled circuit board.

Figure 11:
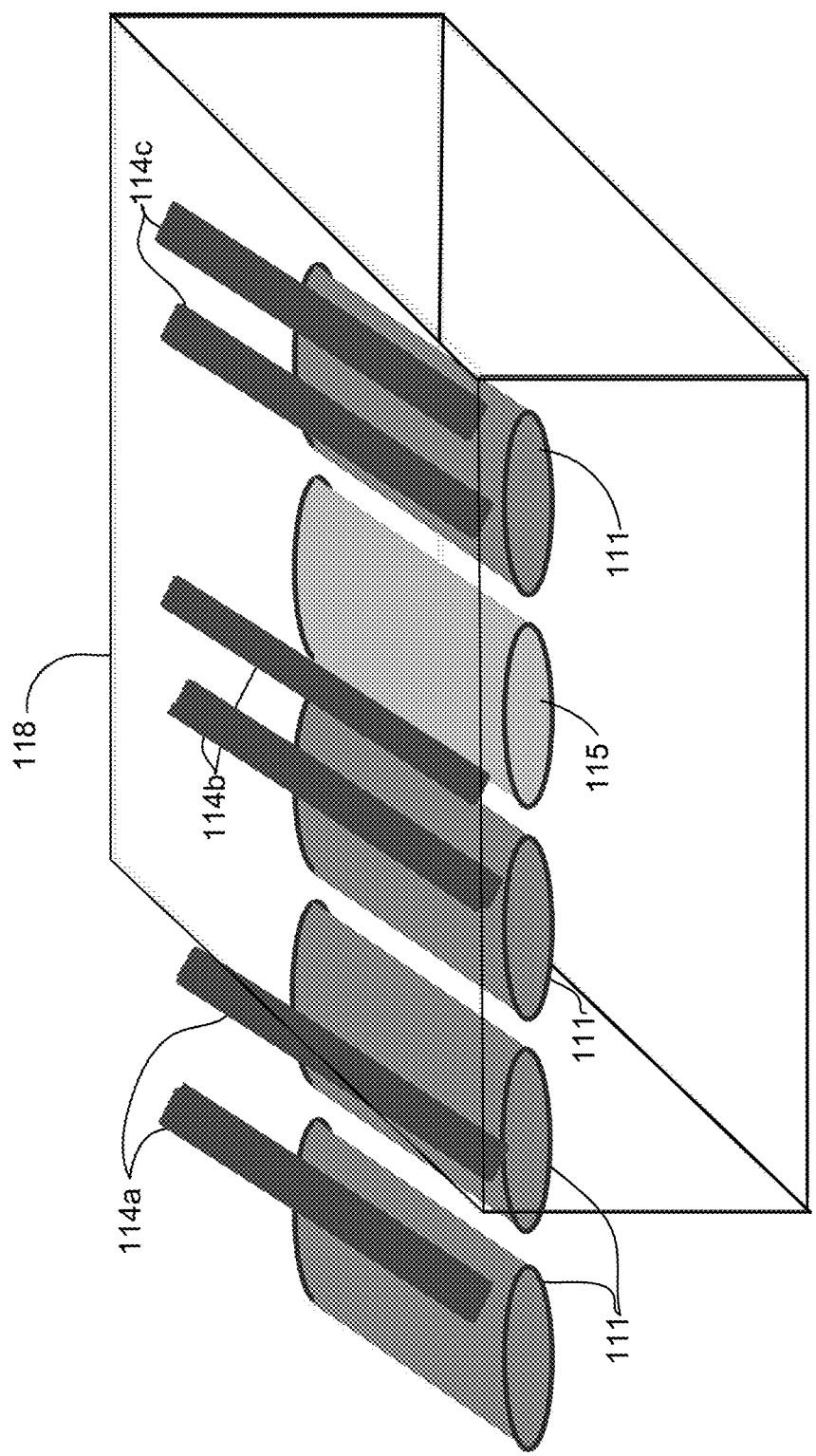
FIG. 11 is a perspective of the inspection window showing traces relative to the fiber bundle marker.

FIG. 11 is a perspective illustrating an inspection window 118 for viewing traces relative to a marker bundle 115. For simplification glass bundles are only shown in one direction. The layer includes differential pairs 114a, 114b, and 114c. A viewer or AOI tool may be used to measure the traces relative to the marker bundle 115. In the example shown in FIG. 11, a first and third differential pair 114a, 114c have minimum skew since both of the traces are located on a glass bundle 111, while a second differential pair 114b has maximum skew since one trace is on the glass bundle 111, while the other trace is located on the resin between the glass bundles 111, 115.

Limits may be defined for the acceptable differential skew that the copper layer may have. Measurements gathered during AOI through the inspection window may be used to determine if the amount of fiber weave skew is acceptable. After the etch process of a core layer, the skew may be unacceptable, in which case it can be scrapped with minimal impact to the total board yield. After the board press and etch process, the skew across all layers may be unacceptable; in this case the board can be scrapped before the drilling and finishing processes.

The printed circuit boards described herein may operate, for example, in a network device within a data communications network or any other computer or electronic device (e.g., desktop, laptop, handheld device, wireless device, tablet, gaming device, mobile device, phone, etc.). The network may include any number of network devices in communication via any number of nodes (e.g., routers, switches, gateways, controllers, edge devices, access devices, aggregation devices, core nodes, intermediate nodes, or other network devices), which facilitate passage of data within the network.

Figure 12:
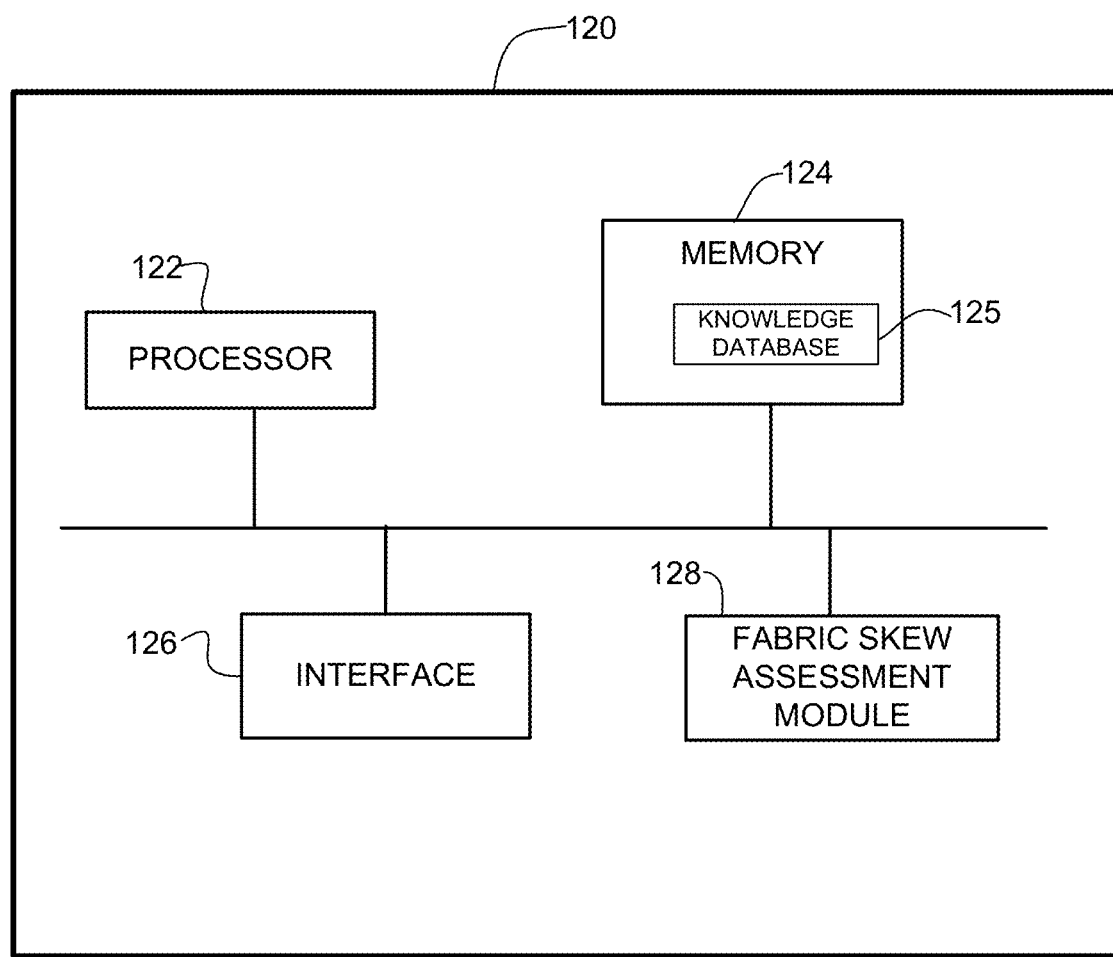
FIG. 12 depicts an example of a network device useful in implementing embodiments described herein.

FIG. 12 illustrates an example of a network device (computer) 120 that may implement the embodiments described herein. The network device may comprise one or more PCBs designed using one or more embodiments described herein or may be used to perform a fiber weave skew assessment as described above with respect to FIG. 5, for example. In one embodiment, the network device 120 is a programmable machine that may be implemented in hardware, software, or any combination thereof. The network device 120 includes one or more processor 122, memory 124, network interface (port) 126, and fiber skew assessment module (e.g., code, software, logic, device) 128.

Memory 124 may be a volatile memory or non-volatile storage, which stores various applications, operating systems, modules, and data for execution and use by the processor 122. The network device 120 may include any number of memory components. Memory 124 may include a knowledge database 125 storing collected data on variation parameters as previously described.

Logic may be encoded in one or more tangible media for execution by the processor 122. For example, the processor 122 may execute codes stored in a computer-readable medium such as memory 124. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 122 may process data received from the interface 126 and may perform one or more of the steps shown in FIG. 5. The network device 120 may include any number of processors 122.

The network interface 126 may comprise any number of interfaces (linecards, ports) for receiving data or transmitting data to other devices. The network interface 126 may include, for example, an Ethernet interface for connection to a computer or network.

It is to be understood that the network device 120 shown in FIG. 12 and described above is only an example and that different configurations of network devices may be used. For example, the network device 120 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A method comprising:
receiving a printed circuit board design layout for a specific printed circuit board design on a printed circuit board at a skew assessment module, the printed circuit board design layout identifying routing information for a plurality of differential pair traces on the printed circuit board;
receiving values for a plurality of user defined skew parameters associated with fiber weave skew for the printed circuit board design layout at the skew assessment module;
receiving variation parameters from a database comprising statistical data collected on fiber weave variation for one or more of said skew parameters at the skew assessment module, wherein said collected data is based on measurements of manufactured samples;
calculating a fiber weave skew estimate for said printed circuit board design layout based on said plurality of skew parameters, said routing information, and said variation parameters at the skew assessment module; and
determining if said fiber weave skew estimate for said printed circuit board design layout is within a specified skew allowance.

2. The method of claim 1 further comprising calculating a relative fiber weave skew based on said skew parameters and comparing said relative fiber weave skew to a specified limit before calculating said fiber weave skew estimate; wherein said relative fiber weave skew identifies said differential pair traces that may have more skew relative to other of said differential pair traces.

3. The method of claim 2 further comprising calculating a new relative fiber weave skew based on a new layout or one or more new skew parameters when the relative fiber weave skew is over said specified limit.

4. The method of claim 1 wherein said layout comprises differential pair routing pitch and printed circuit board rotation.

5. The method of claim 1 wherein said skew parameters comprise dielectric constants for a fiber and a resin.

6. The method of claim 1 wherein said skew parameters comprise a fiber weave style.

7. The method of claim 1 wherein said variation parameters comprise minimum and maximum values for fiber weave geometry.

8. The method of claim 1 wherein said variation parameters comprise a fiber bundle width and gap between adjacent fiber bundles.

9. The method of claim 1 further comprising manufacturing the printed circuit board and testing the printed circuit board for compliance with said skew estimate.

10. The method of claim 1 wherein said measurements of manufactured samples comprise a distance between fiber bundles in the fiber weave.

* * * * *